United States Patent
Song et al.

(10) Patent No.: US 9,136,503 B2
(45) Date of Patent: Sep. 15, 2015

(54) ORGANIC LIGHT-EMITTING DISPLAY DEVICE AND METHOD OF MANUFACTURING THE ORGANIC LIGHT-EMITTING DISPLAY DEVICE

(71) Applicant: Samsung Display Co., Ltd., Yongin, Gyeonggi-Do (KR)

(72) Inventors: Won-Jun Song, Yongin (KR); Sung-Soo Koh, Yongin (KR); Sun-Hee Lee, Yongin (KR); Jung-Ha Son, Yongin (KR); Boo-Young Jun, Yongin (KR); Kwan-Hee Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 14/311,001

(22) Filed: Jun. 20, 2014

(65) Prior Publication Data

US 2014/0326973 A1   Nov. 6, 2014

Related U.S. Application Data

(60) Continuation of application No. 14/153,508, filed on Jan. 13, 2014, now Pat. No. 8,796,810, which is a division of application No. 13/427,607, filed on Mar. 22, 2012, now Pat. No. 8,664,670.

(30) Foreign Application Priority Data

Mar. 28, 2011   (KR) ..................... 10-2011-0027703

(51) Int. Cl.
*H01L 35/24* (2006.01)
*H01L 51/52* (2006.01)

(52) U.S. Cl.
CPC ............ *H01L 51/5253* (2013.01); *H01L 51/52* (2013.01); *H01L 51/5259* (2013.01)

(58) Field of Classification Search
CPC . H01L 51/52; H01L 51/5253; H01L 51/5259; H01L 21/0262; H01L 21/02642; H01L 21/02647; H01L 33/007; H01L 33/641; H01L 21/0237; H01L 21/0242; H01L 21/02458; H01L 33/36; H01L 33/64; H01L 21/0254; H01L 51/0048; H05B 33/14; C09K 11/06; Y10S 977/742
USPC ............... 257/12–13, 81, 84, 88–89, 98–100, 257/103, 344–347, 431–433, 706–707; 313/112, 501–506
See application file for complete search history.

(56) References Cited

U.S. PATENT DOCUMENTS 5,059,861 A * 10/1991 Littman et al. ................ 313/503
6,190,780 B1    2/2001 Shoji et al.
(Continued)

FOREIGN PATENT DOCUMENTS

KR   10-2005-0031659   4/2005
KR   10-2005-0034126   4/2005
(Continued)

*Primary Examiner* — Dung Le
(74) *Attorney, Agent, or Firm* — Robert E. Bushnell, Esq.

(57) ABSTRACT

An organic light-emitting display device comprises a substrate, an anode electrode formed on the substrate, an organic layer formed on the anode electrode, a cathode electrode formed on the organic layer, and an organic capping layer formed on the cathode electrode and containing a capping organic material and a rare-earth material which has higher oxidizing power than the material which forms the cathode electrode.

20 Claims, 7 Drawing Sheets

(56) References Cited

U.S. PATENT DOCUMENTS

| | | |
|---|---|---|
| 6,703,180 B1 * | 3/2004 | Boroson et al. ............... 430/200 |
| 7,476,453 B2 | 1/2009 | Rohrer Boutwell et al. |
| 2007/0178396 A1 | 8/2007 | Wu et al. |
| 2008/0050581 A1 | 2/2008 | Miwa et al. |
| 2008/0178907 A1 | 7/2008 | Duda et al. |
| 2010/0207513 A1 * | 8/2010 | Begley et al. ................. 313/504 |
| 2011/0207248 A1 | 8/2011 | Yamazaki et al. |

FOREIGN PATENT DOCUMENTS

| | | |
|---|---|---|
| KR | 10-0686075 | 2/2007 |
| KR | 10-0745759 | 7/2007 |

* cited by examiner

ORGANIC LIGHT-EMITTING DISPLAY DEVICE AND METHOD OF MANUFACTURING THE ORGANIC LIGHT-EMITTING DISPLAY DEVICE

CROSS-REFERENCE TO RELATED APPLICATIONS AND CLAIM OF PRIORITY

This application is a continuation of application Ser. No. 14/153,508, filed 13 Jan. 2014, which is a divisional of application Ser. No. 13/427,607, filed 22 Mar. 2012, which are herein incorporated by reference in their entirety. This application also makes reference to, incorporates the same herein, and claims all benefits accruing under 35 U.S.C. §119 from an application earlier filed in the Korean Intellectual Property Office on the 28 Mar. 2011 and there duly assigned Serial No. 10-2011-0027703.

BACKGROUND OF THE INVENTION

1. Field of the Invention

The present invention relates to a metal wiring structure, an organic light-emitting display device using the same, and a method of manufacturing the organic light-emitting display device. More particularly, the present invention relates to a metal wiring structure configured to prevent oxidation of a metal electrode, an organic light-emitting display device using the metal wiring structure, and a method of manufacturing the organic light-emitting display device.

2. Description of the Related Art

The rapid development of the information technology (IT) industry is dramatically increasing the use of display devices. Recently, there have been demands for display devices which are lightweight and thin, consume low power and provide high resolution. To meet these demands, liquid crystal displays or organic light-emitting displays having a plurality of metal wirings and a plurality of light-emitting elements are being developed.

Metal wirings are included in various devices such as semiconductor devices, display devices and portable devices. When the metal wirings are damaged by oxidation and corrosion, the performance of these devices may deteriorate.

For example, an organic light-emitting display includes a cathode electrode as a metal wiring. The cathode electrode needs to be thin in order to improve light transmittance. However, a thin cathode electrode may increase a resistance value, leading to a reduction or non-uniformity in luminance.

To improve luminance, a metal with low absorptance and high reflectivity (for example, Ag) may be used for the cathode electrode. However, Ag is easily oxidized by highly reactive oxygen or vapor, resulting in defective pixels.

SUMMARY OF THE INVENTION

The present invention provides a metal wiring structure configured to prevent oxidation of a metal wiring.

The present invention also provides an organic light-emitting display device in which a cathode electrode can have both high light transmittance and low resistance value.

The present invention also provides an organic light-emitting display device in which oxidation of a cathode electrode is prevented so as to suppress generation of defective pixels.

However, aspects of the present invention are not restricted to the ones set forth herein. The above and other aspects of the present invention will become more apparent to one of ordinary skill in the art to which the present invention pertains by referencing the detailed description of the present invention given below.

According to an aspect of the present invention, an organic light-emitting display device comprises a substrate, an anode electrode formed on the substrate, an organic layer formed on the anode electrode, a cathode electrode formed on the organic layer, and an organic capping layer formed on the cathode electrode and containing a capping organic material and a rare-earth material which has higher oxidizing power than the material that forms the cathode electrode.

According to another aspect of the present invention, a metal wiring structure comprises a substrate, a metal wiring formed on the substrate and containing Ag, and a capping layer formed on the metal wiring and containing an organic material and a rare-earth material which has higher oxidizing power than the material that forms the metal wiring.

According to another aspect of the present invention, a method of manufacturing an organic light-emitting display device comprises providing a lower substrate, forming an anode electrode on the lower substrate, forming an organic layer on the anode electrode, forming a cathode electrode on the organic layer, and forming on the cathode electrode an organic capping layer which contains a capping organic material and a rare-earth material having higher oxidizing power than the material which forms the cathode electrode.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIGS. 3A and 3B are cross-sectional views of an organic light-emitting display device according to an exemplary embodiment of the present invention, wherein FIG. 3B is an enlarged cross-sectional view of a region 'A' shown in FIG. 3A;

DETAILED DESCRIPTION OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will also be understood that, when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe the relationship of one element or feature relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

A metal wiring structure according to an exemplary embodiment of the present invention will be described with reference to FIGS. 1 and 2.

Figure 1:
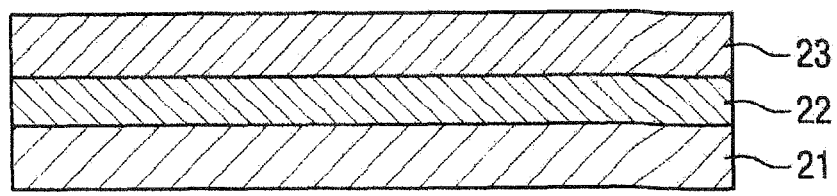
FIG. 1 is a cross-sectional view of a metal wiring structure according to an exemplary embodiment of the present invention.
Figure 2:
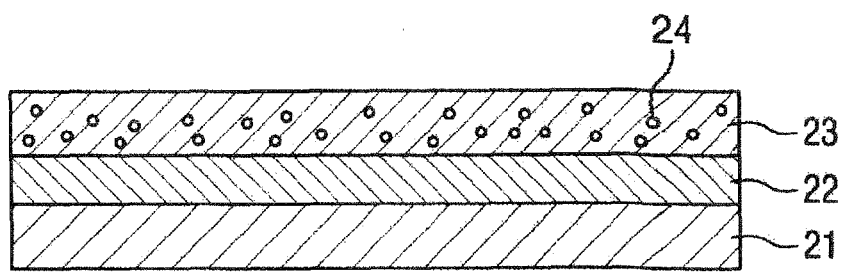
FIG. 2 is a cross-sectional view of the metal wiring structure of FIG. 1 in which a capping layer has a rare-earth material added therein.

FIG. 1 is a cross-sectional view of a metal wiring structure according to an exemplary embodiment of the present invention, and FIG. 2 is a cross-sectional view of the metal wiring structure of FIG. 1 in which a capping layer has a rare-earth material added therein.

Referring to FIG. 1, the metal wiring structure according to the current exemplary embodiment includes a metal wiring 22 and a capping layer 23 which is formed on the metal wiring 22 of a material having higher oxidizing power than the material which forms the metal wiring 22.

The metal wiring 22 may be formed on a substrate 21. The substrate 21 may be made of a transparent glass material containing $SiO_2$ as a main component. The substrate 21 may also be made of a transparent plastic material. The transparent plastic material which forms the substrate 21 may be an organic material selected from the group consisting of polyethersulphone (PES), polyacrylate (PAR), polyetherimide (PEI), polyethylene napthalate (PEN), and polyethylene terephthalate (PET).

The metal wiring 22 may be formed on one surface or both surfaces of the substrate 21. The metal wiring 22 may not necessarily be formed directly on the substrate 21. Another layer may be interposed between the substrate 21 and the metal wiring 22, or the substrate 21 itself may be omitted.

The metal wiring structure may form a circuit which performs different functions according to devices to which the metal wiring structure is applied. For example, when the metal wiring 22 is used in a liquid crystal display (LCD), a driving voltage and/or a common voltage may be applied to determine a direction in which liquid crystals are driven. When the metal wiring 22 is used in an organic light-emitting display, it may form an electric field in an organic layer, thereby causing the organic layer to emit light. The functions of the metal wiring 22 are not limited to the above functions and may vary according to devices to which the metal wiring structure according to the current exemplary embodiment are applied.

The metal wiring 22 may be made of metal with high conductivity and/or high light transmittance. For example, the metal wiring 22 may be made of Ag.

The capping layer 23 is formed on the metal wiring 22. The capping layer 23 may contain a material having higher oxidizing power than the material which forms the metal wiring 22. In particular, if Ag is contained in the metal wiring 22, it may be oxidized by reacting with oxygen or moisture in the air, and the oxidized Ag may reduce light transmittance of the metal wiring 22. However, the capping layer 23 formed on the metal wiring 22 protects the metal wiring 22 from oxidation. To protect the metal wiring 22 more thoroughly, the capping layer 23 may cover not only a top surface of the metal wiring 22 but also side surfaces of the metal wiring 22 which would be exposed otherwise.

In some embodiments, the capping layer 23 may contain a transparent material which transmits light.

In FIG. 2, two or more materials are contained in the capping layer 23 to reinforce an oxidation preventing function of the capping layer 23. Referring to FIG. 2, the capping layer 23 may contain an organic material and a rare-earth material 24 bonded to the organic material or dispersed in the capping layer 23. The rare-earth material 24 may have higher oxidizing power than the material which forms the metal wiring 22.

Applicable examples of the rare-earth material 24 may include Sc, Y, La, Ce, Pr, Nd, Pm, Sm, Eu, Gd, Tb, Dy, Ho, Er, Tm, Yb, and Lu. In some embodiments, if the metal wiring 22 contains Ag, the capping layer 23 may contain Yb.

In some embodiments, the top surface of the capping layer 23 may be exposed. That is, no layer may be stacked on the capping layer 23. Accordingly, the top surface of the capping layer 23 may be directly exposed to air, gas, or a vacuum.

When the top surface of the capping layer 23 is exposed, it may be exposed to oxygen or moisture in the air. The oxygen or the moisture penetrates into the capping layer 23 and reacts with a material with high oxidizing power, e.g., the rare-earth material 24 of the capping layer 23. This suppresses the reaction of the oxygen or the moisture with Ag of the metal wiring 22 under the capping layer 23, thus preventing oxidation of the metal wiring 22.

As described above, the metal wiring structure according to the current exemplary embodiment can be applied in various devices, such as semiconductor devices and display devices. An organic light-emitting display device using the metal wiring structure according to the current exemplary embodiment will hereinafter be described. This, however, is not intended to limit the use of the metal wiring structure.

Hereinafter, an organic light-emitting display device according to an exemplary embodiment of the present invention will be described with reference to FIGS. 3A and 3B.

Figure 3A:
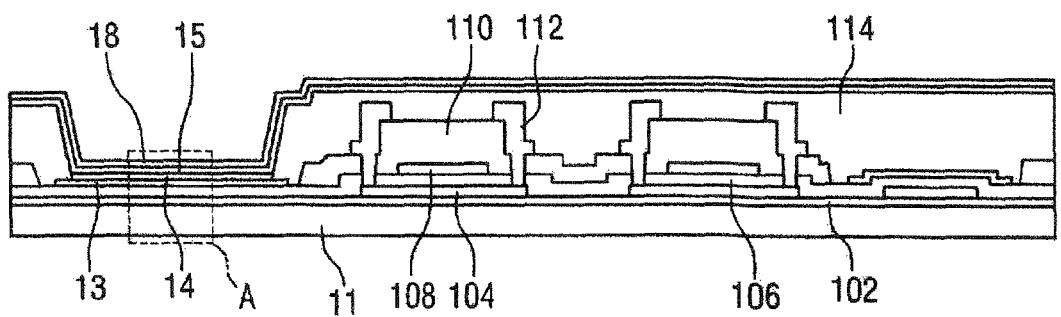
Figure 3B:
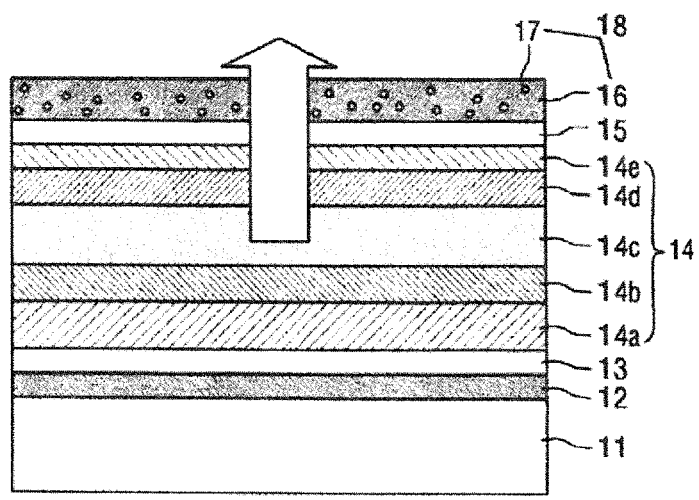

FIGS. 3A and 3B are cross-sectional views of an organic light-emitting display device according to an exemplary embodiment of the present invention, wherein FIG. 3B is an enlarged cross-sectional view of a region 'A' shown in FIG. 3A.

Referring to FIG. 3B, the organic light-emitting display device according to the current exemplary embodiment includes a substrate 11, an anode electrode 13 formed on the substrate 11, an organic layer 14 formed on the anode electrode 13, a cathode electrode 15 formed on the organic layer 14, and an organic capping layer 18 formed on the cathode electrode 15.

The substrate 11 may be made of a transparent glass material containing $SiO_2$ as a main component. The substrate 11 may also be made of a transparent plastic material. The plastic material which forms the substrate 11 may be an insulating organic material. Examples of the insulating organic material may include PES, PAR, PEI, PEN, PET, polyphenylene sulfide (PPS), polyallylate, polyimide, polycarbonate (PC), cellulose triacetate (TAC), cellulose acetate propionate (CAP), and a combination of the same.

In a bottom emission organic light-emitting display device in which an image is realized toward the substrate 11, the substrate 11 should be made of a transparent material. However, in a top emission organic light-emitting display device in which an image is realized away from the substrate 11, the substrate 11 may not necessarily be made of a transparent material. In this case, the substrate 11 may be made of opaque metal. When the substrate 11 is made of metal, it may contain one or more materials selected from the group consisting of Fe, Cr, Mn, Ni, Ti, Mo, and stainless steel (SUS). However, the material which forms the substrate 11 is not limited to the above materials. The substrate 11 may also be made of metal foil.

As shown in FIG. 3A, a buffer layer 102, an active layer 104, a gate insulating film 106, a gate electrode 108, an interlayer insulating film 110, source/drain electrodes 112, and a pixel defined layer 114 may be formed on the substrate 11. The above components may be provided on the whole surface of the substrate 11 or on part of the surface of the substrate 11 to form a thin-film transistor or a capacitor.

The buffer layer 102 may be formed on the substrate 11 so as to planarize the substrate 11 and prevent penetration of impurities into the substrate 11. The buffer layer 102 may be a single layer of SiOx, SiNx or $SiO_2$ Nx, or a multilayer of these materials.

The active layer 104 may be formed on the buffer layer 102. The active layer 104 may be a semiconductor layer. For example, the active layer 104 may contain silicon (Si). Specifically, the active layer 104 may be an amorphous silicon (a-Si) layer or a polycrystalline silicon (p-Si) layer. Otherwise, the active layer 104 may be made of, but is not limited to, Ge, GaP, GaAs, or AlAs.

The active layer 104 may be formed by doping a portion of a semiconductor layer with P- or N-type impurities. In some embodiments, the active layer 104 which constitutes a thin-film transistor may be partially doped with impurities so as to have semiconductor properties, and the active layer 104 which constitutes a capacitor may be entirely doped with impurities so as to form an electrode.

The gate insulating film 106 may be formed on the active layer 104 so as to cover the active layer 104 and insulate the active layer 104 from the gate electrode 108. Like the buffer layer 102, the gate insulating film 106 may be a single layer of $SiO_2$, SiNx or $SiO_2$Nx, or a multilayer of these materials. The gate insulating film 106 may be made of the same or different material as the buffer layer 102.

The gate electrode 108 may be formed on the gate insulating film 106. The gate electrode 108 transmits a gate signal to control the light emission of each pixel. The gate electrode 108 may be a single layer of Al or an Al alloy, such as Cr—Al, Mo—Al or Al—Nd, or a multilayer of a Cr or Mo alloy and an Al alloy stacked on the Cr or Mo alloy. In addition, the gate electrode 108 may contain one or more of ITO, Mo and Al.

The interlayer insulating film 110 may be formed on the gate electrode 108. The interlayer insulating film 110 electrically insulates the gate electrode 108 from the source/drain electrodes 112. Like the buffer layer 102, the interlayer insulating film 110 may be a single layer of $SiO_2$, SiNx or $SiO_2$Nx, or a multilayer of these materials. Contact holes for forming the source/drain electrodes 112 may be formed in the interlayer insulating film 110.

The source/drain electrodes 112 may be formed on the interlayer insulating film 110 and electrically connected to the active layer 104 by the contact holes. The source/drain electrodes 112 may be made of any one material selected from Mo, Cr, W, MoW, Al, Al—Nd, Ti, TiN, Cu, a Mo alloy, an Al alloy, and a Cu alloy. The source/drain electrodes 112 may also be formed as a triple layer of Mo—Al—Mo.

The pixel defined layer 114 may be formed on the source/drain electrodes 112. The pixel defined layer 114 is formed on the whole surface of the substrate 11 so as to cover the thin-film transistor and the capacitor. The pixel defined layer 114 may expose all or part of the anode electrode 13 so as to define a pixel portion. The pixel defined layer 114 may be made of an inorganic material, such as $SiO_2$, SiNx or $SiO_2$Nx, or may be a multilayer of these materials.

Referring to FIG. 3B, in a top emission organic light-emitting display device in which the organic layer 14 emits light toward the top (front side) of the display device through the organic capping layer 18, a reflective film 12 may further be formed between the substrate 11 and the anode electrode 13.

The reflective film 12 may reflect light, which is emitted from an emitting layer 14c toward the bottom (back side) of the display device, in a direction toward the top (front side) of the display device, thereby improving light efficiency.

The reflective film 12 brings about an optical resonance effect between itself and the cathode electrode 15 so as to enable more light to proceed toward the cathode electrode 15.

The reflective film 12 may be made of any material, preferably, a material with high light reflectivity, such as metal. The thickness of the reflective film 12 may also be adjusted to ensure sufficient light reflection. The reflective film 12 may be made of Al, Ag, Cr or Mo, and may be formed to a thickness of approximately 1,000 Å.

The anode electrode 13 may be formed on the reflective film 12. In a bottom emission organic light-emitting display device, the anode electrode 13 may be a transparent conductive material such as indium tin oxide (ITO) or indium zinc oxide (IZO). In a top emission organic light-emitting display device, the anode electrode 13 may not necessarily be made of a transparent conductive material.

In the organic light-emitting display device according to the current exemplary embodiment, the anode electrode 13 may be made of a metal oxide with a high work function, such as $Al_2O_3$ or ZnO.

The organic layer 14 is formed on the anode electrode 13. The organic layer 14 may include a hole injecting layer 14a, a hole transporting layer 14b, an emitting layer 14c, an electron transporting layer 14d, and an electron injecting layer 14e stacked sequentially.

Holes injected from the hole injecting layer 14a and electrons injected from the electron injecting layer 14e combine together in the emitting layer 14c so as to generate light. In the case of a top emission organic light-emitting display device, the generated light is emitted upward in FIG. 3B so as to exit through the cathode electrode 15 and the organic capping layer 18.

The organic layer 14 may further include an auxiliary hole transporting layer which helps holes to easily reach the emitting layer 14c.

The hole injecting layer 14a may be made of the same material as the hole transporting layer 14b. To increase the efficiency of the hole injecting layer 14a, the hole injecting layer 14a may be partly doped with p-type impurities.

The cathode electrode 15 generates an electric field together with the anode electrode 13 thereunder, thereby causing the emitting layer 14c to emit light. In the organic light-emitting display device according to the current exemplary embodiment, the cathode electrode 15 may be made of a light-transmitting material, specifically, a metal with a low work function. The cathode electrode 15 may be formed thin so as to become semi-transmissive and reflective. Examples of the metal with a low work function include Mg, Ag, Al, Au and Cr.

In particular, Ag exhibits high light transmittance and high light reflectivity characteristics. Thus, the cathode electrode 15 made of Ag has high light efficiency. Since a metal such as Ag is highly reactive, it is easily oxidized by oxygen or moisture particles in the air.

Therefore, the organic capping layer 18 may contain a capping organic material 16 and a rare-earth material 17 which has higher oxidizing power than the material which forms the cathode electrode 15.

Examples of the rare-earth material 17 may include Sc, Y, La, Ce, Pr, Nd, Pm, Sm, Eu, Gd, Tb, Dy, Ho, Er, Tm, Yb, and Lu. Yb may be contained in the organic capping layer 18.

As shown in FIG. 3B, the organic capping layer 18 may have light transmitting characteristics. There are no restrictions on the capping organic material 16, and any material which can transmit light can be used.

The rare-earth material 17, when over-deposited in the organic capping layer 18, may reduce the overall luminance by absorbing light. The reduced luminance may deteriorate optical characteristics of the organic capping layer 18. To secure sufficient luminance, the rare-earth material 17 may be added at 15 wt % or less of the organic capping layer 18.

In addition, a refractive index of the organic capping layer 18 made of a mixture of the capping organic material 16 and the rare-earth material 17 may be maintained at 1.5 or higher, so that the organic capping layer 18 shows certain optical characteristics.

As described above, the organic capping layer 18 contains the rare-earth material 17 with high oxidizing power. Thus, when the top surface of the organic capping layer 18 is exposed to oxygen or moisture in the air, the oxygen or the moisture penetrates into the organic capping layer 18 and reacts with the rare-earth material 17. Accordingly, the reaction of the oxygen or the moisture with the cathode electrode 15 under the organic capping layer 18 is suppressed. Since the oxidation of the cathode electrode 15 is prevented, the generation of defective pixels due to the oxidation of the cathode electrode 15 can be prevented.

Figure 4:
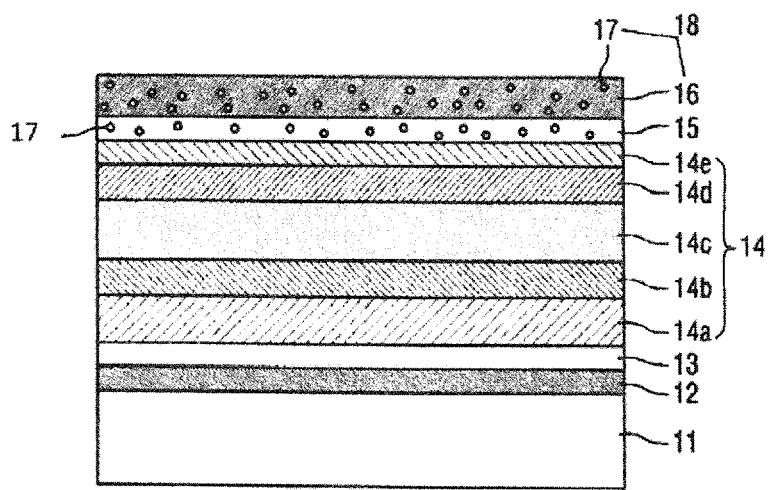
FIG. 4 is a cross-sectional view of the organic light-emitting display device of FIG. 3B in which a cathode electrode has a rare-earth material added therein.

In some other embodiments of the present invention, the rare-earth material 17 may be contained not only in the organic capping layer 18 but also in the cathode electrode 15, as shown in FIG. 4.

FIG. 4 is a cross-sectional view of an organic light-emitting display device according to another exemplary embodiment of the present invention.

Referring to FIG. 4, a cathode electrode 15 may contain a rare-earth material 17 in addition to a conductive material such as Ag. Applicable examples of the rare-earth material 17 may include Sc, Y, La, Ce, Pr, Nd, Pm, Sm, Eu, Gd, Tb, Dy, Ho, Er, Tm, Yb, and Lu. In some embodiments, the cathode electrode 15 may contain Ag, and Yb may be provided as the rare-earth material.

The rare-earth material 17 may be doped or diffused into the cathode electrode 15 in the process of forming the organic capping layer 18. When moisture or oxygen in the air partially passes through the organic capping layer 18 and reaches the cathode electrode 15, the rare-earth material 17 contained in the cathode electrode 15 reacts with the moisture or the oxygen before Ag. Thus, the oxidation of Ag can further be prevented.

Hereinafter, a method of manufacturing an organic light-emitting display device according to an exemplary embodiment of the present invention will be described.

Figure 5:
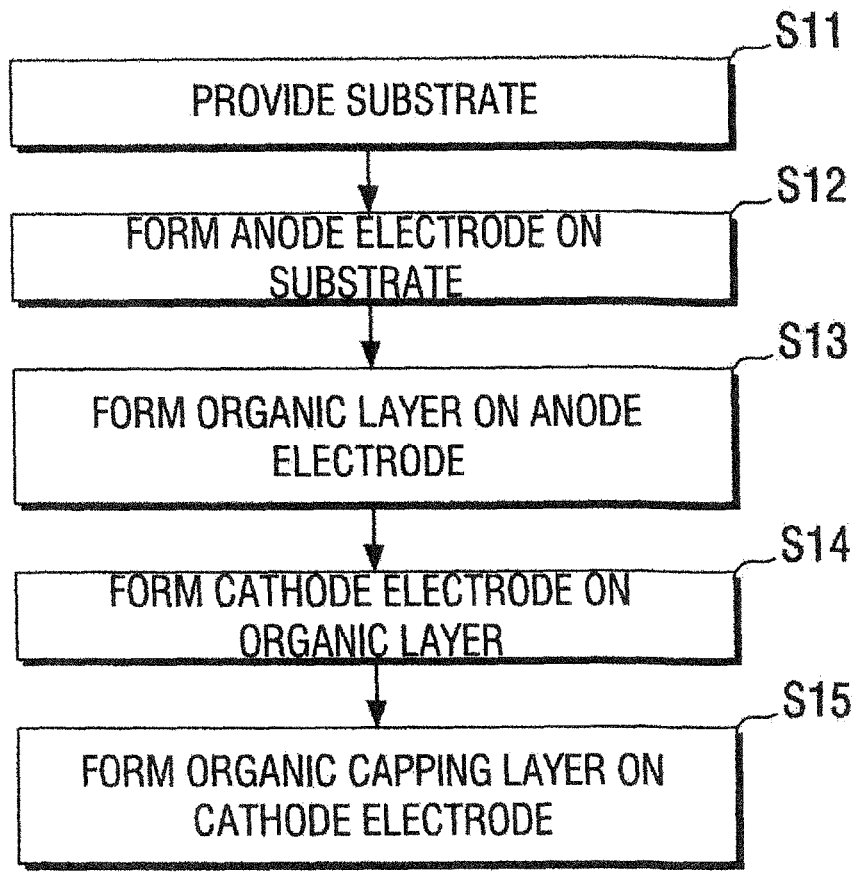
FIG. 5 is a flowchart illustrating a method of manufacturing an organic light-emitting display device according to an exemplary embodiment of the present invention.

FIG. 5 is a flowchart illustrating a method of manufacturing an organic light-emitting display device according to an exemplary embodiment of the present invention.

The method of manufacturing an organic light-emitting display device according to the current exemplary embodiment includes providing a substrate (operation S11), forming an anode electrode on the substrate (operation S12), forming an organic layer on the anode electrode (operation S13), forming a cathode electrode on the organic layer (operation S14), and forming an organic capping layer on the cathode electrode (operation S15). The organic capping layer contains a capping organic material and a rare-earth material having higher oxidizing power than the material which forms the cathode electrode.

Further referring to FIG. 5, a substrate is provided (operation S11). As described above, the substrate may be made of a transparent glass material or a plastic material. In a top emission organic light-emitting display device, the substrate may not necessarily be made of a transparent material. When the substrate is made of metal, it may contain one or more materials selected from the group consisting of Fe, Cr, Mn, Ni, Ti, Mo, and SUS.

The substrate may be divided into a thin-film transistor region, a capacitor region and a pixel region.

An anode electrode is formed on the substrate (operation S12). The anode electrode may be controlled by a thin-film transistor, and may be made of a metal oxide with a high work function such as $Al_2O_3$ or ZnO.

Next, an organic layer is formed on the anode electrode (operation S13). The forming of the organic layer may include forming a hole injecting layer, a hole transporting layer, an emitting layer, an electron transporting layer and an electron injecting layer. A method of forming the organic layer will now be described in greater detail with reference to FIGS. 6A thru 6F.

FIGS. 6A thru 6F are cross-sectional views sequentially illustrating the process of forming an organic layer in the manufacturing method of FIG. 5. More specifically, FIGS. 6A thru 6F are cross-sectional views illustrating a method of forming an organic layer of an organic light-emitting display device according to an exemplary embodiment of the present invention.

Figure 6A:
FIGS. 6A thru 6F are cross-sectional views sequentially illustrating the process of forming an organic layer in the manufacturing method of FIG. 5.

Referring to FIG. 6A, a hole injecting layer 14a is formed on the anode electrode. The material which forms the hole injecting layer 14a may be selected from, but is not limited to, a triphenylene-based material, a perylene-based material, a pyrene-based material, a tetracene-based material, and an anthracene-based material. Specifically, the hole injecting layer 14a may contain one or more materials selected from the group consisting of copper phthalocyanine, 1,3,5-tricarbazolylbenzene, 4,4'-biscarbazolylbiphenyl, polyvinylcarbazole, m-biscarbazolylphenyl, 4,4'-biscarbazolyl-2,2'-dimethylbiphenyl, 4,4',4''-tri(N-carbazolyl)triphenylamine (TCTA), 4,4',4''-tris(3-methylphenylamino)triphenylamine (m-MTDATA), 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N,N'-diphenyl-[1,1-biphenyl]-4,4'diamine (TPD), N,N'-di(naphthalene-1-yl)-N,N'-diphenyl benzidine (α-NPD), N,N'-diphenyl-N,N'-bis(1-naphthyl)-(1,1'-biphenyl)-4,4'-diamine (NPB), poly(9,9-dioctylfluorene-co-N-(4-butylphenyl)diphenylamine) (TFB), and poly(9,9-dioctylfluorene-co-bis-N,N-phenyl-1,4-phenylenediamine (PFB).

Figure 6B:
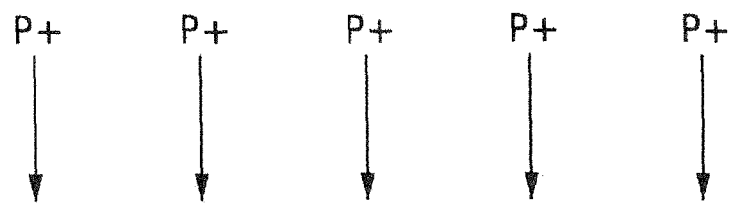
Figure 6B:

Referring to FIG. 6B, the hole injecting layer 14a is doped with p-type impurities. Examples of the p-type impurities doped into the hole injecting layer 14a include an organic compound, such as F4-TCNQ or TCNQ, and an inorganic oxidizing agent such as iodine, FeCl3, FeF3, SbCl5, metal chloride, or metal fluoride.

Figure 6C:
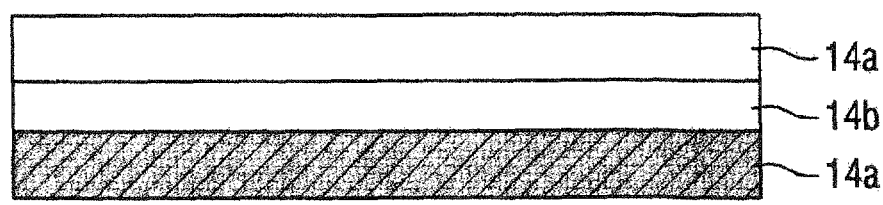

Referring to FIG. 6C, a hole transporting layer 14b is formed on the hole injecting layer 14a doped with the p-type impurities. The hole transporting layer 14b may be made of the same material as the hole injecting layer 14a. Unlike the hole injecting layer 14a, the hole transporting layer 14b may be undoped with impurities.

The hole transporting layer material 14b may contain one or more materials selected from a triphenylene-based material, a perylene-based material, a pyrene-based material, an NPD-based material, a TPD-based material and a photoconductive polymer.

Figure 6D:
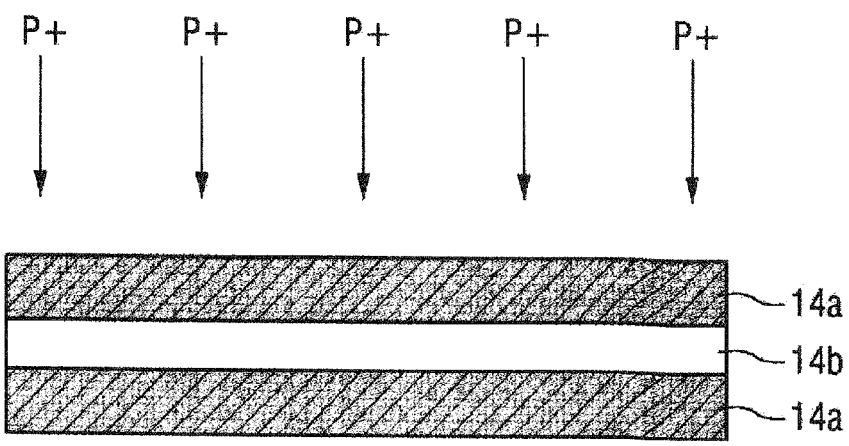

Referring to FIGS. 6C and 6D, another hole injecting layer 14a may be formed again on the hole injecting layer 14a and the hole transporting layer 14b. That is, the hole injecting layer 14a and the hole transporting layer 14b may be repeatedly and alternately stacked to form a plurality of layers. This process shown in FIG. 6D is optional.

Figure 6E:
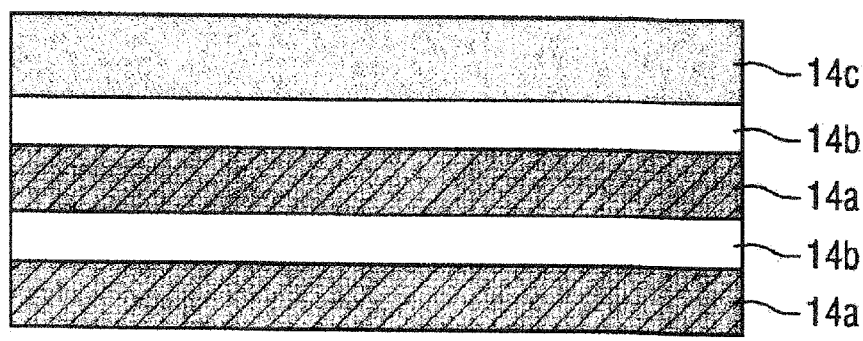

Referring to FIG. 6E, an emitting layer 14c is formed on the hole injecting layers 14a and the hole transporting layers 14b.

Figure 6F:
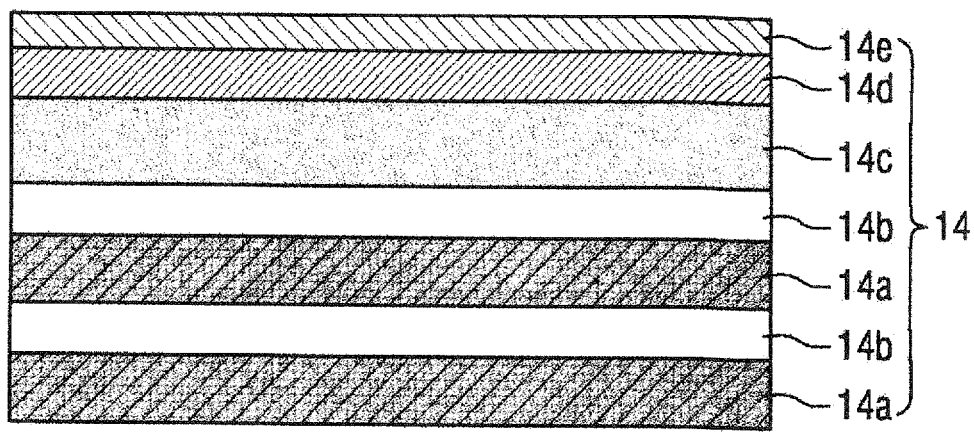

Referring to FIG. 6F, an electron transporting layer 14d and an electron injecting layer 14e are stacked. In the current exemplary embodiment, the electron transporting layer 14d and the electron injecting layer 14e are stacked together. However, the present invention is not limited thereto, and the electron injecting layer 14e can be omitted.

The electron transporting layer 14d may contain one or more materials selected from an organic material, such as $Alq_3$, $BeBq_2$, $Zn_2$, PBD, TAZ, Liq, $Mgq_2$ or $Znq_2$, and an inorganic material containing a halide compound, such as LiF, NaF, KF, RbF, CsF, FrF, MgF or CaF, and an oxide such as $Li_2O$, $Na_2O$, $K_2O$, $Cs_2O$, $LiBO_2$, $LiNbO_3$, $Al_2O_3$ or $B_2O_5$.

Referring back to FIG. 5, a cathode electrode is formed on the organic layer (operation S14). The cathode electrode may contain Ag. The cathode electrode may further contain Yb to prevent oxidation of Ag as described above.

An organic capping layer is formed on the cathode electrode (operation S15). The organic capping layer may contain a capping organic material and a rare-earth material. A method of forming the organic capping layer will now be described in greater detail with reference to FIG. 7.

Figure 7:
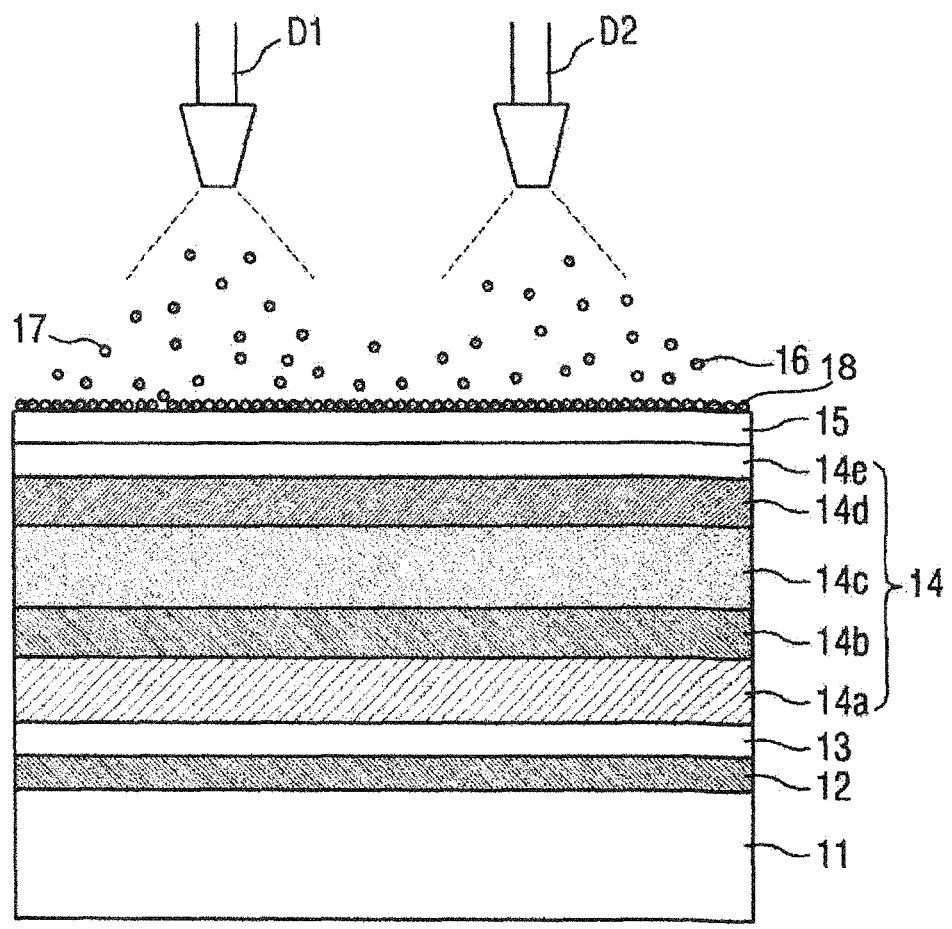
FIG. 7 is a cross-sectional view illustrating the process of forming an organic capping layer in the manufacturing method of FIG. 5.

FIG. 7 is a cross-sectional view illustrating the process of forming an organic capping layer in the manufacturing method of FIG. 5. More specifically, FIG. 7 is a cross-sectional view illustrating a method of forming an organic capping layer of an organic light-emitting display device according to an exemplary embodiment of the present invention.

Referring to FIG. 7, an organic capping layer 18 may be formed by simultaneously depositing a capping organic material 16 and a rare-earth material 17. For example, particles of the capping organic material 16 and particles of the rare-earth material 17 from different sources D1 and D2, respectively, may be deposited simultaneously to form the organic capping layer 18.

Exemplary embodiments of the present invention provide at least one of the following advantages.

A metal wiring has high transmittance and conductivity but is easily oxidized by air. However, a metal wiring structure which can prevent oxidation of the metal wiring can be provided.

To prevent the oxidation of a cathode electrode, a material with high oxidizing power is added in the cathode electrode or in a capping layer on the cathode electrode. Accordingly, the oxidation of the cathode electrode can be prevented. Furthermore, the cathode electrode can have both high light transmittance and low resistance value.

Since the oxidation of the cathode electrode is prevented, generation of defective pixels can be suppressed.

However, the effects of the present invention are not restricted to the ones set forth herein. The above and other effects of the present invention will become more apparent to one of ordinary skill in the art to which the present invention pertains by referencing the above disclosure and the claims.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only, and not for purposes of limitation.

What is claimed is:

1. An organic light-emitting display device, comprising:
   a substrate;
   an anode electrode formed on the substrate;
   an organic layer formed on the anode electrode;
   a cathode electrode formed on the organic layer and containing a rare-earth material; and
   an organic capping layer formed on the cathode electrode and containing a capping organic material.

2. The display device of claim 1, wherein the organic capping layer containing the rare-earth material.

3. The display device of claim 2, wherein the rare-earth material has higher oxidizing power than a material which forms the cathode electrode and the capping organic material.

4. The display device of claim 3, wherein the rare-earth material is Yb.

5. The display device of claim 2, wherein the rare-earth material which contained the organic capping layer is added at no greater than 15 wt % of the organic capping layer.

6. The display device of claim 1, wherein the organic layer comprises a hole injecting layer, a hole transporting layer, an emitting layer, an electron transporting layer, and an electron injecting layer, wherein the hole injecting layer is made of a same material as the hole transporting layer and is doped with p-type impurities.

7. The display device of claim 6, wherein the hole injecting layer and the hole transporting layer are repeatedly and alternately stacked to form a plurality of layers.

8. The display device of claim 1, wherein the cathode electrode contains Ag.

9. The display device of claim 1, wherein the organic capping layer has a refractive index of not less than 1.5.

10. A method of manufacturing an organic light-emitting display device, the method comprising the steps of:
    providing a lower substrate;
    forming an anode electrode on the lower substrate;
    forming an organic layer on the anode electrode;
    forming a cathode electrode on the organic layer and containing a rare-earth material; and
    forming an organic capping layer on the cathode electrode, the organic capping layer containing a capping organic material and the rare-earth material.

11. The display device of claim 10, wherein the rare-earth material has higher oxidizing power than a material which forms the cathode electrode and the capping organic material.

12. The method of claim 11, wherein the rare-earth material is Yb.

13. The method of claim 10, wherein the step of forming the organic capping layer comprises depositing the capping organic material and the rare-earth material simultaneously.

14. The method of claim 10, wherein the step of forming the organic capping layer comprises despositing the rare-earth material at not greater than 15 wt % of the organic capping layer.

15. The method of claim 10, wherein the step of forming the organic layer comprises forming a hole injecting layer, a hole transporting layer, an emitting layer, an electron transporting layer, and an electron injecting layer, wherein the hole injecting layer is made of a same material as the hole transporting layer and is doped with p-type impurities.

16. The method of claim 15, wherein the step of forming the organic layer further comprises repeatedly and alternately stacking the hole injecting layer and the hole transporting layer so as to form a plurality of layers.

17. The method of claim 10, wherein the step of forming the organic layer comprises: depositing a hole transporting layer material; and doping a portion of the hole transporting layer material with p-type impurities.

18. The method of claim 17, wherein the step of forming the organic layer further comprises depositing the hole transporting layer material again on the portion of the hole transporting layer material doped with the p-type impurities.

19. The method of claim 12, wherein the cathode electrode contains Ag.

20. The method of claim 10, wherein the organic capping layer has a refractive index of not less than 1.5.

* * * * *